(12) United States Patent
Choi

(10) Patent No.: US 7,307,000 B2
(45) Date of Patent: Dec. 11, 2007

(54) METHOD OF FABRICATING A CAPACITOR FOR A SEMICONDUCTOR DEVICE

(75) Inventor: Chee Hong Choi, Busan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/367,325

(22) Filed: Mar. 6, 2006

(65) Prior Publication Data

US 2006/0154437 A1 Jul. 13, 2006

Related U.S. Application Data

(62) Division of application No. 11/024,652, filed on Dec. 30, 2004.

(30) Foreign Application Priority Data

Dec. 31, 2003 (KR) ............... 10-2003-0101822

(51) Int. Cl.
*H01L 21/20* (2006.01)
(52) U.S. Cl. ............... 438/393; 257/532; 257/E27.048; 438/396
(58) Field of Classification Search ......... 257/311, 257/E27.048; 438/393, 396
See application file for complete search history.

(56) References Cited

U.S. PATENT DOCUMENTS

| 6,902,981 | B2 | 6/2005 | Ng et al. |
| 6,933,191 | B2 | 8/2005 | Biery et al. |
| 2002/0056869 | A1 | 5/2002 | Morimoto |
| 2004/0248359 | A1 | 12/2004 | Hieda |
| 2005/0082592 | A1* | 4/2005 | Chang et al. ............ 257/306 |

FOREIGN PATENT DOCUMENTS

| KR | 2001-0093673 | 10/2001 |
| KR | 2002-0037295 | 5/2002 |

* cited by examiner

*Primary Examiner*—Jerome Jackson
*Assistant Examiner*—Paul Budd
(74) *Attorney, Agent, or Firm*—Lowe Hauptman Ham & Berner LLP

(57) ABSTRACT

A capacitor for a semiconductor device includes a first inter metal dielectric layer is disposed on a substrate. A first electrode is disposed on the first inter metal dielectric layer. A second electrode partially overlaps the first electrode. A first dielectric layer is disposed between the first and second electrodes. A third electrode partially overlaps the second electrode. A second dielectric layer is disposed between the second and third electrodes. An etch stop layer is disposed on the first, second, and third electrodes. A second inter metal dielectric layer is formed on the etch stop layer and includes first, second, and third via holes exposing the first and third electrodes and the etch stop layer. First, second, and third plugs are disposed in the first, second, and third via holes.

10 Claims, 3 Drawing Sheets

METHOD OF FABRICATING A CAPACITOR FOR A SEMICONDUCTOR DEVICE

BACKGROUND OF THE INVENTION (a) Field of the Invention

The present invention relates to a semiconductor device and, more particularly, to a capacitor having metal/insulator/metal (MIM) structure and a method for fabricating the capacitor.

(b) Description of the Related Art

An MIM capacitor for a semiconductor device is formed as a metal/insulator/metal structure. The metal and insulator structures are layered on one another, such that a required capacitance can be provided.

Metal wirings are formed on an inter metal dielectric of the capacitor, and the metal wirings are connected to electrodes through plugs formed in the inter metal dielectric. By this arrangement, electricity can be applied to the electrodes.

The layered structures include via holes defining the plugs, the via holes having depths different from one another.

That is, the via holes are formed at different depths because the electrodes are formed on different layers. Since the via holes are formed at different depths, the etch process is performed with respect to the deepest via hole, such that the surface of the electrodes (upper electrode) exposed through the previously completed via holes are damaged while etching the via hole for exposing the low part (lower electrode).

Such damage deteriorates characteristics of the semiconductor device, and reduces the reliability of the device. Accordingly, in order to reduce the damage to the electrodes the etching process is performed using different masks according to the depths of the respective via holes to be formed. However, the utilization of additional masks complicates the fabrication process and increase manufacturing costs.

SUMMARY OF THE INVENTION

To address the above-described and other problems, it is an object of the present invention to provide a capacitor for a semiconductor device. A first inter metal dielectric layer is disposed on a substrate. A first electrode is disposed on the first inter metal dielectric layer. A second electrode partially overlaps the first electrode. A first dielectric layer is disposed between the first and second electrodes. A third electrode partially overlaps the second electrode. A second dielectric layer is disposed between the second and third electrodes. An etch stop layer is disposed on the first, second, and third electrodes. A second inter metal dielectric layer is formed on the etch stop layer and includes first, second, and third via holes exposing the first and third electrodes and the etch stop layer. First, second, and third plugs are disposed in the first, second, and third via holes.

The present invention further provides a method for fabricating a capacitor for a semiconductor device. A first inter metal dielectric layer is formed on a substrate. A first metal layer is formed to fill a trench on the first inter metal dielectric layer. The first metal layer is polished using a chemical mechanical polishing to form a first electrode. A first dielectric layer, a second metal layer, a second dielectric layer, and a third metal layer are formed on the first electrode. The third metal layer is patterned using a selective etching to form a third electrode. The second metal layer is patterned using the selective etching to form a second electrode that overlaps the first electrode and the third electrode. An etch stop layer and a second inter metal dielectric layer are formed to cover the first, second, and third electrodes. The second inter metal dielectric layer are etched using a selective photolithography process to form via holes to expose the etch stop layer. The etch stop layer is removed to expose the first, second, and third electrodes. The via holes are filled to form plugs, the plugs electric connecting with the first, second, and third electrodes. Metal wirings are formed on the second inter metal dielectric layer to conduct electricity to the first to third electrodes through the plugs.

The present invention still further provides a capacitor for a semiconductor device. A first dielectric layer is disposed on a substrate. A first electrode is disposed on the first dielectric layer. A second electrode partially overlaps the first electrode. A second dielectric layer is disposed between the first and second electrodes. A third electrode partially overlaps the second electrode. A third dielectric layer is disposed between the second and third electrodes. An etch stop layer is disposed on the first, second, and third electrodes. A fourth dielectric layer is formed on the etch stop layer and includes first, second, and third via holes exposing the first and third electrodes and the etch stop layer. First, second, and third plugs disposed in the first, second, and third via holes.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

Figure 1:
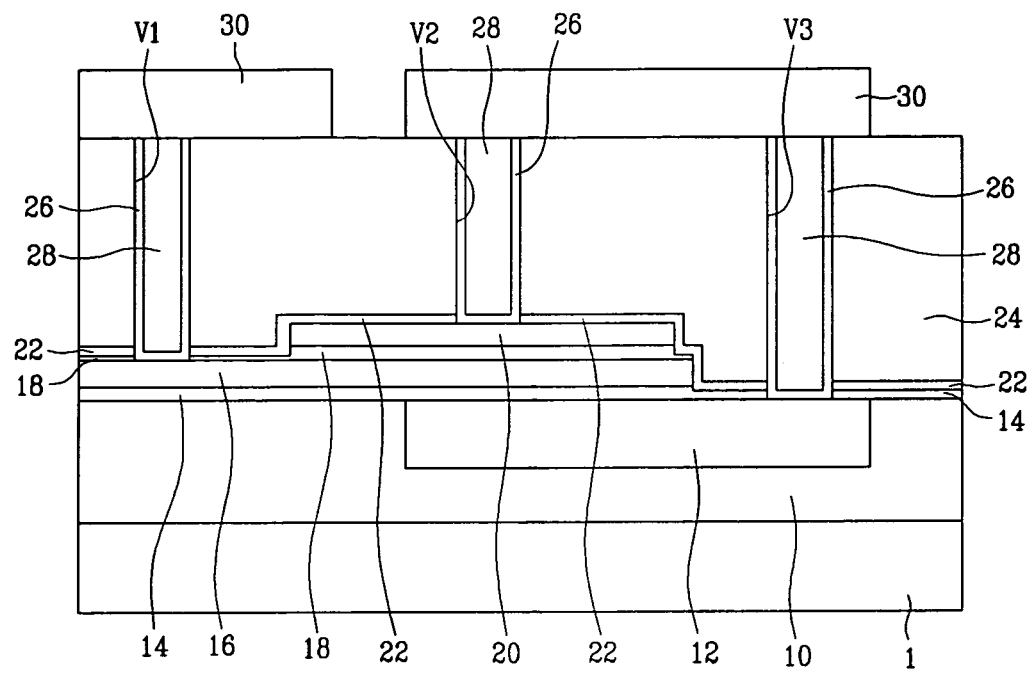
FIG. 1 is a cross sectional view illustrating a capacitor structure of a semiconductor device according to the present invention.

With reference to the accompanying drawings, the present invention is described. It is to be understood, however, that the scope of the claims is not limited to the disclosed embodiments, but rather that various modifications and equivalent arrangements are included within the spirit and scope of the claims.

To clarify multiple layers and regions, the thickness of the layers are enlarged in the drawings. The same reference numbers are used throughout the drawings to refer to the same or similar parts.

FIG. 1 is a cross sectional view illustrating a capacitor structure of a semiconductor device according to the present invention.

As shown in FIG. 1, a first inter metal dielectric (or dielectric layer) 10 is formed on a substrate 1. The substrate 1 includes semiconductor devices (not shown) and/or metal wirings (not shown). A first electrode 12 is disposed in a trench formed in the first inter metal dielectric 10.

On the first electrode 12, a first dielectric layer 14, a second electrode 16, a second dielectric layer 18, and a third electrode 20. The first dielectric layer 14 is arranged between the first electrode 12 and the second electrode 16, and the second dielectric layer 18 is arranged between the second electrode 16 and the third electrode 20. Preferably, the first electrode 12, a first dielectric layer 14, a second electrode 16, a second dielectric layer 18 are sequentially deposited.

The first to third electrodes 12, 16, and 20, and the first and second dielectric layer 14 and 18 are covered by an etch stop layer 22 and an inter metal dielectric layer 24. Via holes are formed over the inter metal dielectric layer 24 and the etch stop layer 22 to expose the first to third electrodes 12, 16, and 20. Specifically, a first via hole V1 exposes the second electrode 18, a second via hole V2 exposes the third electrode 20, and a third via hole V3 exposes the first electrode 12.

At least a portion of the first dielectric layer 14 between the first electrode 12 and the second electrode 16 and at least a portion of the second dielectric layer 18 are formed thicker than other portions. This facilitates removal of portions of the dielectric layers 14 and 18, as described below. The fabrication method is now described.

The first to third electrodes 12, 16, and 20 can be formed of copper, titanium/titanium nitride, aluminum, and/or tungsten. The dielectric layers 14 and 18 can be formed of silicon nitride, silicon oxide, multiple layers including these materials, and/or one or more layers including high permittivity materials such as tantalum oxide.

An etch stop layer 22 and a second inter metal dielectric layer 24 are formed on the third electrode 20. The second inter metal dielectric layer 24 and the etch stop layer 22 are provided with a first to third via holes V1-V3 exposing the second, third and first electrodes 16, 20 and 12 respectively. Inside the via holes V1-V3, plugs 26 and 28 are formed for connecting to the upper metal wirings. The plug 26 includes a barrier metal layer 26A formed along inner wall of the via holes V1-V3, and a layer 28A fills the via hole defined by the barrier metal layer 26A. The layer 28A preferably is formed from tungsten.

On the second inter metal dielectric layer 24, metal wirings 30 connect to the first, second, and third electrodes 12, 16, and 20 through the plugs 26 and 28.

A method for fabricating the above described capacitor for the semiconductor is now described with reference to FIGS. 2-6, which are cross sectional views illustrating fabrication steps.

Figure 2:
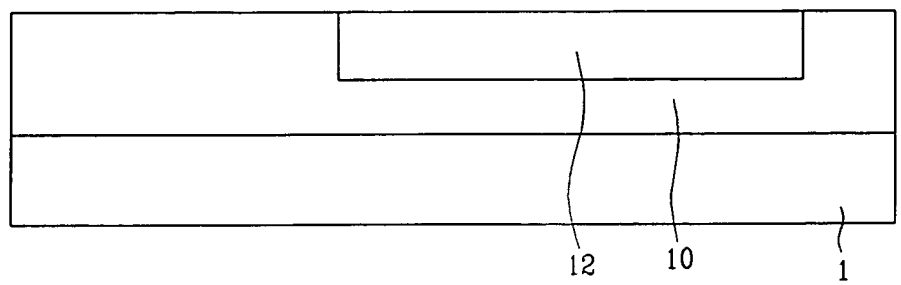
FIGS. 2-6 are cross sectional views illustrating fabrication steps for the semiconductor device of FIG. 1.

As shown in FIG. 2, the first inter metal dielectric layer 10 is formed on the substrate 1, the substrate 1 including semiconductor devices and/or the metal wirings.

The first inter metal dielectric layer 10 can be formed from a low permittivity material, such as plasma enhanced tetra ethyl ortho silicate (PE-TEOS), un-doped silicate glass (USG), and/or fluorine silicate glass (FSG).

A trench is formed by etching a predetermined region of the first inter metal dielectric layer 10 through a selective etch process. The first electrode 12 is completed by forming the first metal layer by depositing copper, titanium/titanium nitride, aluminum, and/or tungsten, and polishing the metal layer through a chemical mechanical polishing process until the first inter metal dielectric layer 10 is exposed.

Figure 3:
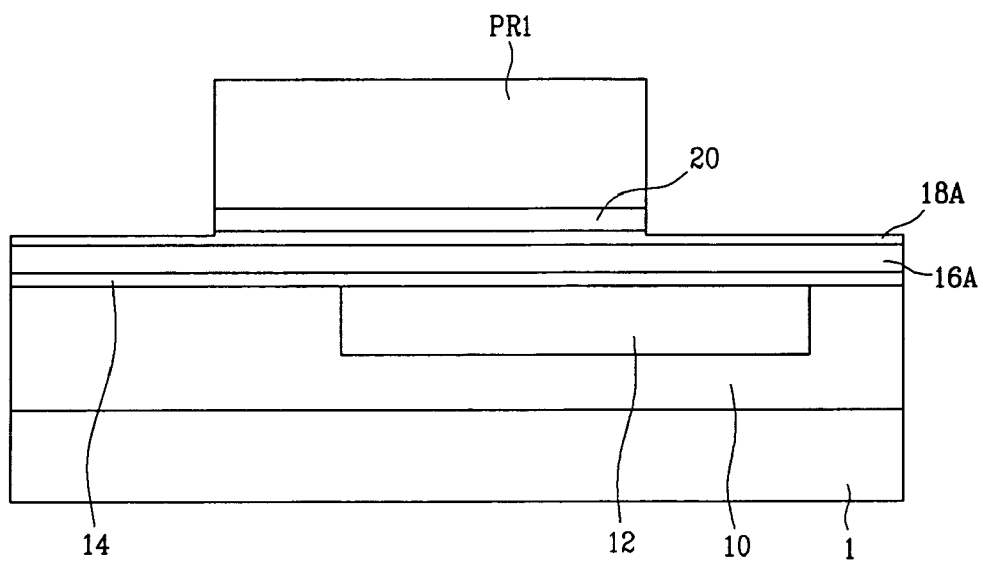

As shown in FIG. 3, the first dielectric layer 14, the second metal layer 16A, the second dielectric layer 18A, and a third metal layer are deposited. Preferably, the first dielectric layer 14, the second metal layer 16A, the second dielectric layer 18A are sequentially deposited. The first dielectric layer 14 can be formed by depositing the silicon nitride and/or the silicon oxide in single or multiple layered structure, and/or can be formed having a layer made from a high permittivity material such as tantalum oxide.

The third electrode 20 is formed by forming a photoresist pattern (PR1) on the third metal layer and etching the third metal layer using the photoresist pattern (PR1) as an etching mask. The third electrode 20 is formed so as to partially overlap the first electrode 12.

At this time, the second dielectric layer 18A is etched so as to be formed at a thickness of about 100 Å. When the second dielectric layer 18A is completely removed, the surface of the second metal layer 16A can be damaged by the etchant or the etching gas in the following process, and thus it is preferable to leave at least a portion of the second dielectric layer 18A.

Figure 4:
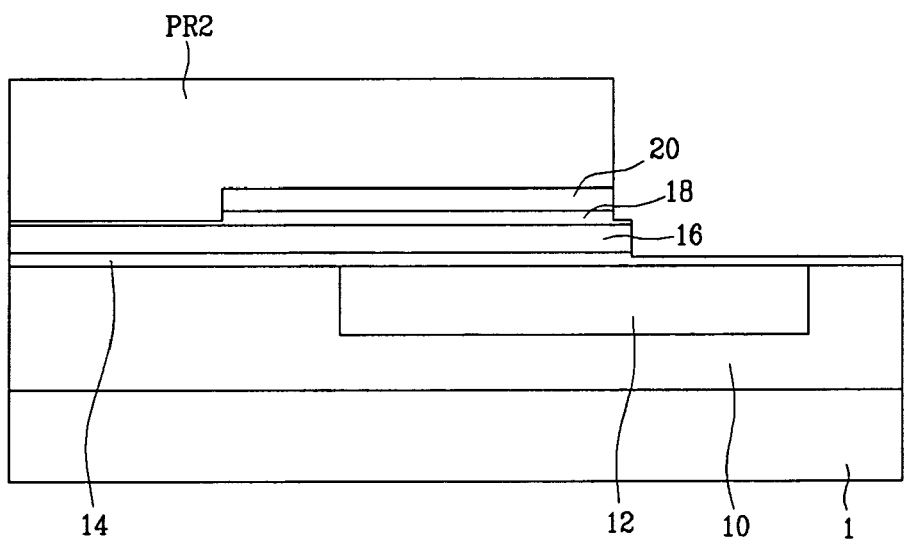

As shown in FIG. 4, the second photoresist pattern (PR2) is formed on the substrate 1. The second photoresist pattern (PR2) covers the third electrode 20, and defines the second electrode 16. The second dielectric layer 18 and the second electrode 16 are formed by etching the second dielectric layer 18A and the second metal layer 16A using the second photoresist pattern (PR2) as a mask. The second photoresist pattern (PR2) can partially overlap the first electrode 12 while covering substantially an entirety of the third electrode 20, such that the third electrode 20 and the first electrode 12 are largely overlapped to form the second electrode 16.

Figure 5:
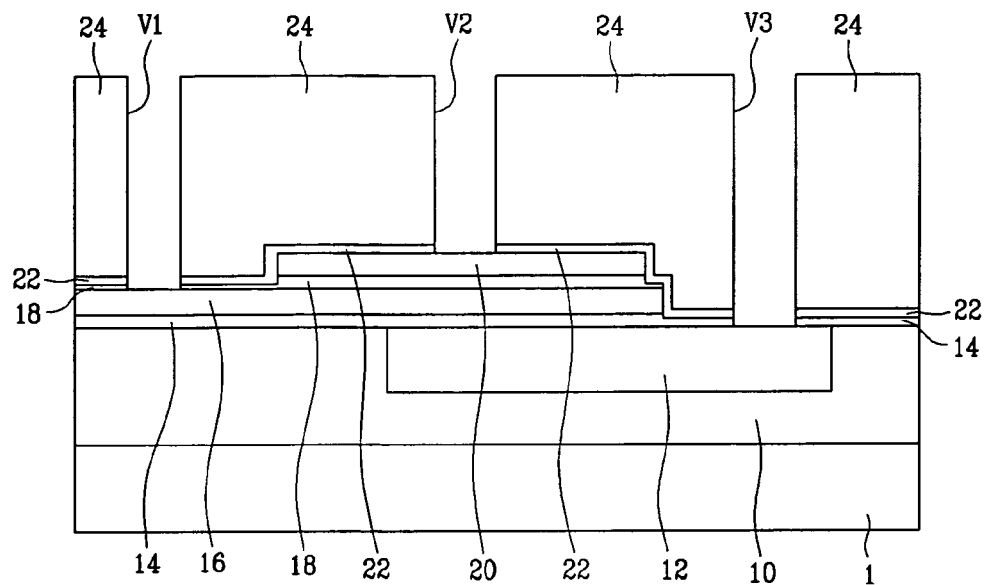

As shown in FIG. 5, the etch stop 22 and the second inter metal dielectric layer 24 can be formed on substantially an entire surface of the substrate. The etch stop layer 22 can be made from a material having high etching selectivity to the second inter metal dielectric layer 24.

The second inter metal dielectric layer 24 can be formed from a material identical or similar to the first inter metal dielectric 10. When the second inter metal dielectric layer 24 is formed from an oxide material, the etch stop layer 22 is preferably formed from a nitride material having high etching selectivity to the oxide material. A predetermined region of the second inter metal dielectric layer 24 is etched to the etch stop layer 22. Etching the etch stop layer 22 forms the first to third via holes V1-V3 exposing the first, second, and third electrodes 12, 16, and 20.

The via holes V1-V3 are formed to expose the respective electrode 12, 16, and 20 after forming the etch stop layer 22 from the dielectric material having high etching selectivity to the second inter metal dielectric 24, and thus the electrodes 12, 16, and 20 are not otherwise exposed to the etching conditions, even thought the via holes V1-V3 differ in depth. Thus, by this arrangement, it is possible to avoid damage of the electrodes 12, 16, and 20.

Specifically, because of the high etching selectivity between the etch stop layer 22 and the second dielectric layer 24, the etch stop layer 22 is not removed while removing the second inter metal dielectric layer 24. Also, since there is little difference in thickness between the etch stop layer 22 and the respective electrodes 12, 16, and 20, the surfaces of the respective electrodes 12, 16, and 20 are not damaged during removal of the dielectric layer remaining after the etch stop layer 22 is removed. Accordingly, the via holes V1-V3 can be completely formed without damaging the electrodes by performing the etching process during a time period during which the electrodes are exposed.

Figure 6:
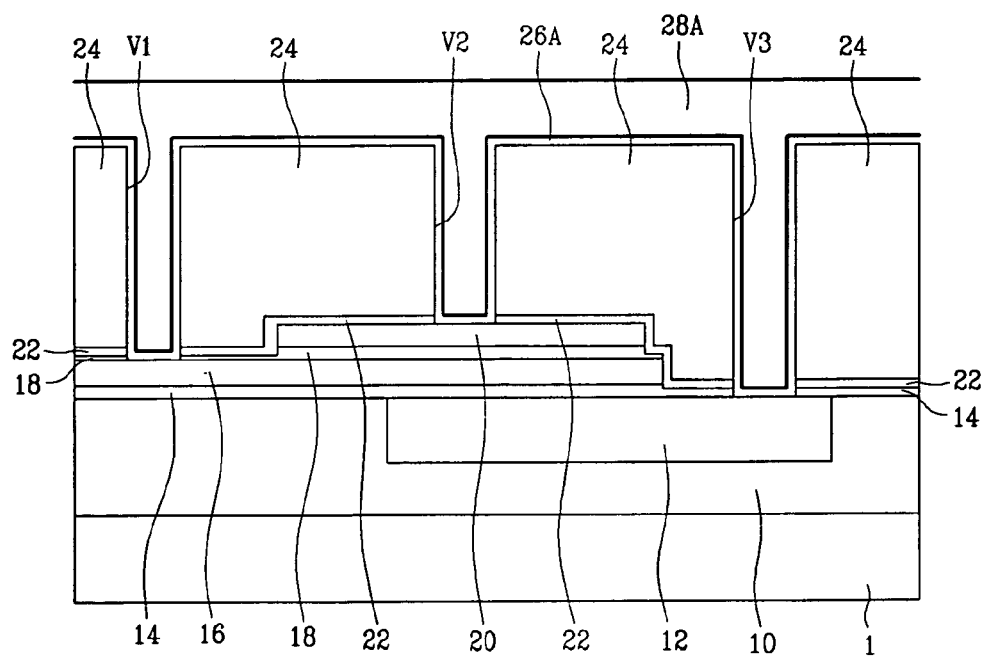

As shown in FIG. 6, a barrier metal layer 26A is formed on the substrate and along the inner walls of the via holes. A layer 28A is filled in the via holes V1-V3 coated by the barrier metal layer 26A. Preferably, the layer 28A is formed from tungsten.

A chemical mechanical polishing is performed until the inter metal dielectric layer 24 is exposed so as to form the plugs 26 and 28 filling the via holes V1-V3. After forming the metal layer on the second inter metal dielectric 24, metal wirings 30 are formed for applying voltages to the first to third electrodes 12, 16, and 20 through the plugs 26 and 28.

As described above, the present invention uses the etch stop layer such that even though the via holes exposing the respective electrode are formed with differing depths, the surfaces of the respective electrodes are not damaged. Also, since the via holes can be formed in a single etching process, it is possible to simplify the manufacturing process, resulting in improvement of device reliability and productivity.

Although preferred embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

The present application incorporates by reference in its entirety an application entitled CAPACITOR OF SEMICONDUCTOR DEVICE AND FABRICATING METHOD THEREOF filed in the Korean Patent Office on Dec. 31, 2004, and assigned serial no. 10-2003-0101822.

What is claimed is:

1. A method for fabricating a capacitor for a semiconductor device, comprising the steps of:
    forming a first inter metal dielectric layer on a substrate;
    forming a first metal layer to fill a trench on the first inter metal dielectric layer;
    polishing the first metal layer using a chemical mechanical polishing to form a first electrode;
    forming a first dielectric layer, a second metal layer, a second dielectric layer, and a third metal layer on the first electrode;
    patterning the third metal layer using a selective etching to form a third electrode;
    patterning the second metal layer using a selective etching to form a second electrode that overlaps the first electrode and the third electrode;
    forming an etch stop layer to cover the first, second, and third electrodes, said etch stop layer being in direct contact with at least the third electrode;
    forming a second inter metal dielectric layer over the etch stop layer;
    etching the second inter metal dielectric layer using a selective photolithography process to form via holes to expose the etch stop layer;
    removing the etch stop layer to expose the first, second, and third electrodes;
    filling the via holes to form plugs, the plugs electrically connecting the first, second, and third electrodes; and
    forming metal wirings on the second inter metal dielectric layer to conduct electricity to the first to third electrodes through the plugs.

2. The method according to claim 1, wherein the etch stop layer comprises a nitride material.

3. The method according to claim 1, wherein both the inter metal dielectric layers comprise an oxide material.

4. The method according to claim 1, wherein a thickness of second dielectric material remains after patterning the third metal layer.

5. The method according to claim 4, wherein the thickness of the second dielectric material is about 100 Å.

6. The method according to claim 1, wherein said etch stop layer has a high etch selectivity to the second inter metal dielectric layer.

7. A method for fabricating a capacitor for a semiconductor device, said method comprising the steps of:
    forming a first inter metal dielectric layer on a substrate;
    forming a first metal layer to fill a trench on the first inter metal dielectric layer;
    polishing the first metal layer using a chemical mechanical polishing to form a first electrode;
    forming a first dielectric layer, a second metal layer, a second dielectric layer, and a third metal layer on the first electrode;
    patterning the third metal layer using a selective etching to form a third electrode;
    patterning the second metal layer using a selective etching to form a second electrode that overlaps the first electrode and the third electrode;
    forming an etch stop layer, said etch stop layer being in direct contact with the first, second and third electrodes;
    forming a second inter metal dielectric layer over the etch stop layer;
    etching the second inter metal dielectric layer to form via holes to expose the etch stop layer;
    removing the etch stop layer to expose the first, second, and third electrodes at a first, second and third contact points respectively;
    filling the via holes to form plugs, the plugs electrically connecting the first, second, and third electrodes; and
    forming metal wirings on the second inter metal dielectric layer to conduct electricity to the first to third electrodes through the plugs, wherein
    the second dielectric material covers an entire upper surface of the second electrode except at the second contact point.

8. The method according to claim 7, wherein said etch stop layer has a high etch selectivity to the second inter metal dielectric layer.

9. The method according to claim 7, wherein the etch stop layer comprises a nitride material.

10. The method according to claim 7, wherein both the inter metal dielectric layers comprises an oxide material.

* * * * *